US011538963B1

(12) United States Patent
Yadavalli et al.

(10) Patent No.: US 11,538,963 B1
(45) Date of Patent: Dec. 27, 2022

(54) III-V LIGHT EMITTING DEVICE HAVING LOW SI—H BONDING DIELECTRIC LAYERS FOR IMPROVED P-SIDE CONTACT PERFORMANCE

(71) Applicant: Ostendo Technologies, Inc., Carlsbad, CA (US)

(72) Inventors: Kameshwar Yadavalli, Carlsbad, CA (US); JeongHyuk Park, Oceanside, CA (US); Gregory Batinica, San Diego, CA (US); Andrew Teren, Carlsbad, CA (US); Clarence Crouch, Peoria, AZ (US); Qian Fan, Carlsbad, CA (US); Hussein S. El-Ghoroury, Carlsbad, CA (US)

(73) Assignee: Ostendo Technologies, Inc., Carlsbad, CA (US)

(*) Notice: Subject to any disclaimer, the term of this patent is extended or adjusted under 35 U.S.C. 154(b) by 0 days.

(21) Appl. No.: 16/280,896

(22) Filed: Feb. 20, 2019

Related U.S. Application Data

(60) Provisional application No. 62/632,855, filed on Feb. 20, 2018.

(51) Int. Cl.
*H01L 33/44* (2010.01)
*H01L 33/00* (2010.01)
(Continued)

(52) U.S. Cl.
CPC .......... *H01L 33/44* (2013.01); *H01L 33/0025* (2013.01); *H01L 33/0062* (2013.01); *H01L 33/08* (2013.01); *H01L 33/32* (2013.01); *H01L 33/42* (2013.01); *H01L 33/52* (2013.01); *H01L 33/54* (2013.01); *H01L 33/56* (2013.01); *H01L 2933/0025* (2013.01)

(58) Field of Classification Search
CPC ......... H01L 33/44; H01L 33/42; H01L 33/08; H01L 33/0025; H01L 33/32; H01L 2933/0025; H01L 33/56; H01L 33/0062; H01L 33/54; H01L 33/52
See application file for complete search history.

(56) References Cited

U.S. PATENT DOCUMENTS 6,028,014 A * 2/2000 Sukjarev .............. C23C 16/402
438/5
7,623,560 B2 11/2009 El-Ghoroury et al.
(Continued)

OTHER PUBLICATIONS

Ceiler, M. F. et al., "Plasma-Enhanced Chemical Vapor Deposition of Silicon Dioxide Deposited at Low Temperatures", Journal of the Electrochemical Society, vol. 142, No. 6, Jun. 1995, pp. 2067-2071.
(Continued)

*Primary Examiner* — S M Sohel Imtiaz
(74) *Attorney, Agent, or Firm* — Greg Caldwell, Esq.; W. Eric Boyd, Esq.

(57) ABSTRACT

A multilayer light emitting device having a plurality of low Si—H bonding dielectric layers is disclosed for improved p-GaN contact performance. Improved p-side contact resistance is provided using one or more bonding, via or passivation layers in a multilayer light emitting structure by the use of processes and dielectric materials and precursors that provide dielectric layers with a hydrogen content of less than 13 at. %.

20 Claims, 4 Drawing Sheets

(51) Int. Cl.
*H01L 33/08* (2010.01)
*H01L 33/42* (2010.01)
*H01L 33/32* (2010.01)
*H01L 33/56* (2010.01)
*H01L 33/52* (2010.01)
*H01L 33/54* (2010.01)

(56) References Cited

U.S. PATENT DOCUMENTS

| | | | |
|---|---|---|---|
| 7,767,479 | B2 | 8/2010 | El-Ghoroury et al. |
| 7,829,902 | B2 | 11/2010 | El-Ghoroury et al. |
| 8,049,231 | B2 | 11/2011 | El-Ghoroury et al. |
| 8,098,265 | B2 | 1/2012 | El-Ghoroury et al. |
| 8,243,770 | B2 | 8/2012 | El-Ghoroury et al. |
| 8,567,960 | B2 | 10/2013 | El-Ghoroury et al. |
| 2004/0155585 | A1* | 8/2004 | Harada .............. H01J 11/38 313/586 |
| 2006/0220043 | A1* | 10/2006 | Kim ................. H01L 33/38 257/96 |
| 2008/0230904 | A1* | 9/2008 | Lee ................. H01L 33/405 257/751 |
| 2008/0237658 | A1* | 10/2008 | Liao ............... H01L 21/76834 257/288 |
| 2009/0086170 | A1* | 4/2009 | El-Ghoroury ....... H01S 5/4043 353/38 |
| 2009/0278998 | A1 | 11/2009 | El-Ghoroury et al. |
| 2009/0309120 | A1* | 12/2009 | Heidborn .......... H01L 25/0756 257/99 |
| 2010/0003777 | A1 | 1/2010 | El-Ghoroury et al. |
| 2010/0066921 | A1 | 3/2010 | El-Ghoroury et al. |
| 2010/0091050 | A1 | 4/2010 | El-Ghoroury et al. |
| 2010/0220042 | A1 | 9/2010 | El-Ghoroury et al. |
| 2011/0156572 | A1* | 6/2011 | Chakraborty .......... H01L 33/64 313/498 |
| 2012/0033113 | A1 | 2/2012 | El-Ghoroury et al. |
| 2012/0080698 | A1* | 4/2012 | Chu .................. H01L 33/20 257/98 |
| 2012/0156843 | A1* | 6/2012 | Green ............. H01L 29/66462 438/261 |
| 2012/0199861 | A1* | 8/2012 | Tsuji ................. H01L 33/42 257/98 |
| 2014/0261960 | A1* | 9/2014 | Lin .................. H01L 21/02 156/64 |
| 2014/0273430 | A1* | 9/2014 | Naik ............... H01L 23/53295 438/613 |
| 2015/0364643 | A1* | 12/2015 | Sumitomo ........ H01L 33/0093 438/29 |
| 2016/0027972 | A1* | 1/2016 | Taeger ............... H01L 33/44 257/100 |
| 2016/0359084 | A1* | 12/2016 | El-Ghoroury ........ H01L 33/32 |
| 2017/0116458 | A1* | 4/2017 | Liu ................. H01L 24/03 |
| 2019/0057950 | A1* | 2/2019 | Mueller ............ H01L 23/522 |

OTHER PUBLICATIONS

Chang, Chorng-Ping et al., "Fluorinated chemistry for high-quality, low hydrogen plasma-deposited silicon nitride films", Journal of Applied Physics, vol. 62, No. 4, Aug. 15, 1987, pp. 1406-1415.

Lin, Wei et al., "Low-Temperature Oxide Wafer Bonding for 3-D Integration: Chemistry of Bulk Oxide Matters", IEEE Transactions on Semiconductor Manufacturing, vol. 27, No. 3, Aug. 2014, pp. 426-430.

Lucovsky, G. et al., "Plasma enhanced chemical vapor deposition: Differences between direct and remote plasma excitation", Journal of Vacuum Science & Technology A, vol. 5, No. 4, Jul./Aug. 1987, pp. 2231-2238.

Machida, Katsuyuki et al., "Improvement of Water-Related Hot-Carrier Reliability by Using ECR Plasma-SiO2", IEEE Transactions on Electron Devices, vol. 41, No. 5, May 1994, pp. 709-714.

Pai, P. G. et al., "Infrared spectroscopic study of SiOx films produced by plasma enhanced chemical vapor deposition", Journal of Vacuum Science & Technology A, vol. 4, No. 3, May/Jun. 1986, pp. 689-694.

Parsons, G. N. et al., "Low hydrogen content stoichiometric silicon nitride films deposited by plasma-enhanced chemical vapor deposition", Journal of Applied Physics, vol. 70, No. 3, Aug. 1, 1991, pp. 1533-1560.

Sheu, J. K. et al., "The doping process and dopant characteristics of GaN", Journal of Physics: Condensed Matter, vol. 14, May 23, 2002, pp. R657-R702.

Zhang, Guo Q. et al., "More than Moore: Creating High Value Micro/Nanoelectronics Systems", Springer Science+Business Media, LLC, ISBN 978-0-387-75592-2, 2009, pp. 1, 6, 8-9, 20, 74, 281.

* cited by examiner

III-V LIGHT EMITTING DEVICE HAVING LOW SI—H BONDING DIELECTRIC LAYERS FOR IMPROVED P-SIDE CONTACT PERFORMANCE

CROSS REFERENCE TO RELATED APPLICATIONS

This Applications claims the benefit of U.S. Provisional Application No. 62/632,855 filed on Feb. 20, 2018, the disclosure of which is incorporated herein by reference.

TECHNICAL FIELD

Embodiments of the disclosure relate generally to light emitting devices and structures. More particularly, embodiments of the disclosure relate to a III-V material light emitting device and structure comprising one or more dielectric layers having a reduced number of Si—H chemical bonds for improved p-side contact performance.

BACKGROUND

Three-dimensional or "3D" semiconductor integration enables improved performance of semiconductor integrated circuits (ICs) and enables increased functionality on Si-based IC platforms via the heterogeneous integration of different material layers (see e.g., G. Q. Zhang & A. J. van Roosmalen, "More than Moore: Creating High Value Micro/Nanoelectronics Systems", Springer). A non-limiting example of such a device is a CMOS/III-V integrated 3D micro-LED array emissive device referred to as a "Quantum Photonic Imager" display or "QPI®" display (see e.g., U.S. Pat. Nos. 7,623,560, 7,767,479, 7,829,902, 8,049,231, 8,243,770, 8,567,960).

This new class of emissive micro-scale pixel array imager devices is disclosed in, for instance, U.S. Pat. Nos. 7,623,560, 7,767,479, 7,829,902, 8,049,231, 8,243,770, 8,567,960, and 8,098,265, the disclosures of which are incorporated herein by reference.

These QPI® display devices desirably feature high brightness, very fast multi-color light intensity and spatial modulation capabilities all in a very small device size that includes all necessary image processing control circuitry. The solid state light (SSL) emitting pixels of these devices may be either a light emitting diode (LED) or a laser diode (LD), or both, which device's on-off state is controlled by control circuitry contained within a complementary metal-oxide-semiconductor (CMOS) controller chip (or device) upon which the emissive micro-scale pixel array of the QPI® display imager is bonded and electronically coupled.

The size of the pixels comprising the QPI® displays may be in the range of approximately 5-20 microns with a typical chip-level emissive surface area being in the range of approximately 15-150 square millimeters. The pixels of the above emissive micro-scale pixel array display devices are individually addressable spatially, chromatically and temporally through the drive circuitry of its CMOS controller chip. The brightness of the light generated by such imager devices can reach multiple 100,000 cd/m$^2$ at reasonably low power consumption.

In a micro-LED device such as a QPI® display, repeated hydrogen exposure during fabrication in the various material deposition operations and the release (i.e., desorption) of hydrogen from hydrogen-containing dielectric layers in the device during thermal cycling can cause significant degradation of (GaN-based) III-Nitride p-side contacts, and thereby negatively affecting the performance and reliability of the entire device.

Among the most common detrimental results of hydrogen and thermal exposure during device fabrication is a significant increase in the resistance of (GaN-based) III-Nitride p-side contacts with the consequent requirement of higher driving voltages for device operation.

Accordingly, what is needed for the optimum functioning of micro-LED device, such as a QPI® display, are fabrication methods, processes and device structures that mitigate hydrogen exposure of p-side contacts either during the device dielectric layer depositions or during thermal cycle or both.

BRIEF DESCRIPTION OF THE DRAWINGS

Embodiments of the disclosure are illustrated by way of example and not limitation in the figures of the accompanying drawings in which like references indicate similar elements.

The matters defined in the description, such as detailed construction and elements are provided to assist in an understanding of the exemplary embodiments. However, the present disclosure can be practiced without such specifically-defined matters. Also, well-known functions or constructions are not described in detail since they would obscure the invention with unnecessary detail. In order to understand the disclosure and to understand how it may be carried out in practice, a few embodiments will now be described, by way of non-limiting examples only, with reference to the accompanying drawings, in which.

DETAILED DESCRIPTION

Figure 1:
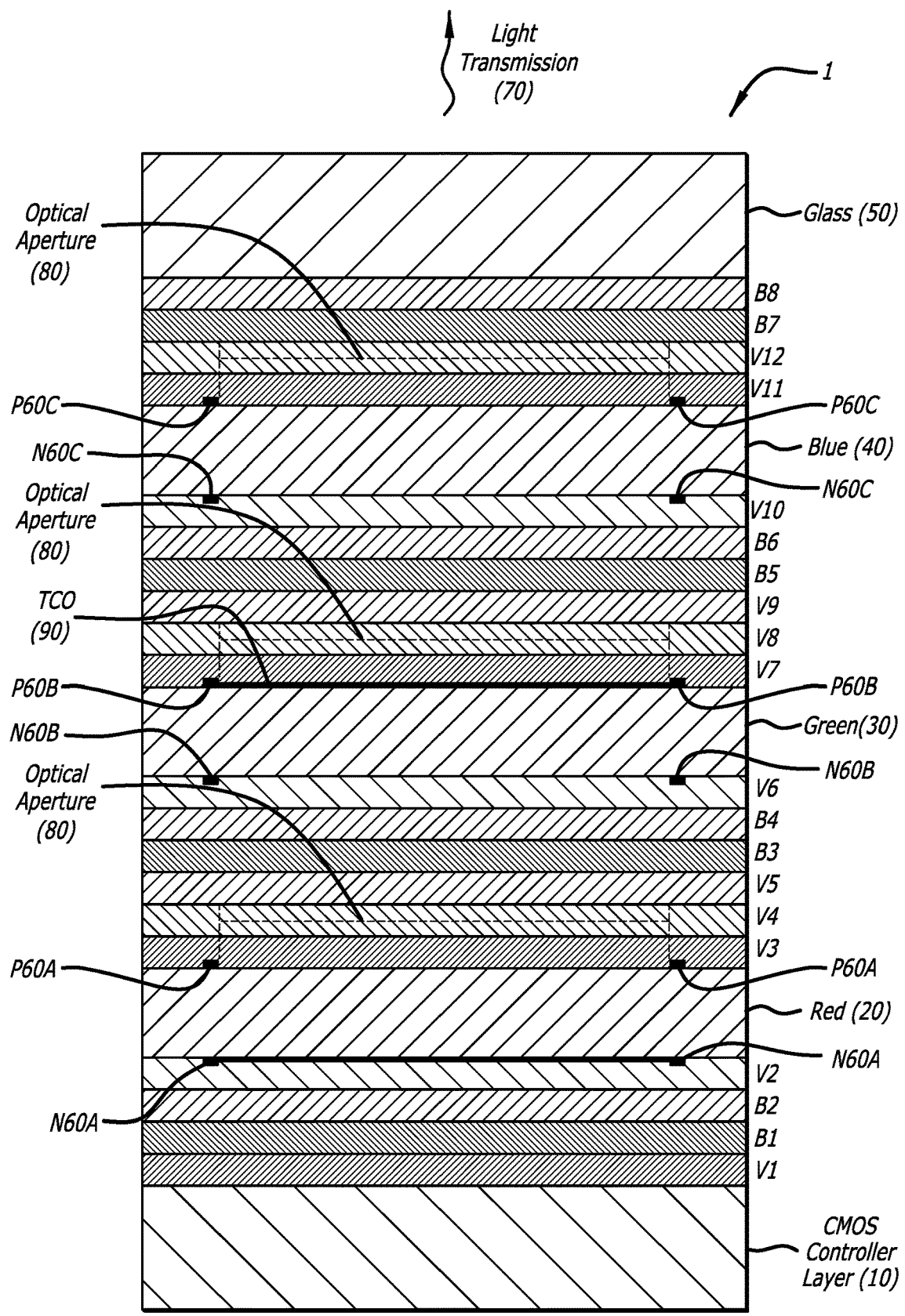
FIG. 1 is a schematic cross-sectional view of a GaN-based III-V Nitride p-side up (emitting surface) multilayer light emitting device illustrating a plurality of low Si—H dielectric bond, inter-metal (via) and passivation layers covering a plurality of p-side and n-side contacts on a plurality of GaN light emitting layers (i.e., red, green, blue) according to one embodiment.

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

Embodiments of the disclosure are applicable to the field of III-Nitride-based devices in general (such as laser diodes (LDs), light emitting diodes (LEDs), micro-LEDs) and to CMOS integrated micro-LED array light emissive devices in particular. Disclosed are fabrication methods for improving such device performance by the incorporation of dielectric layers with lowered Si—H chemical bonds wherein the dielectric layers having a hydrogen content of less than 13 at. % at various stages of the device fabrication process, which lowered Si—H bonds have been verified and characterized using Fourier Transform Infrared Spectroscopy (FTIR).

In some embodiments, the reduction of hydrogen exposure pathways beneficially enables thermal stability of p-side contacts on GaN-based III-Nitride semiconductor materials. The reduction in hydrogen exposure enables improved device life and performance and higher yields through process completion, packaging and device operation in the field.

Hydrogen is known to be incorporated in Si-based dielectrics in the form of Si—H, Si—OH and Si—NH bonds. Hydrogen content measurement of dielectrics thus includes hydrogen from such Si—H, Si—OH and Si—NH bonds. Dielectrics with low Si—H bonding are identified as being optimum for improved p-side contact performance in III-V light emitting devices. For the sake of clarity and brevity, it is noted the term "low hydrogen dielectric" as used herein refers to a dielectric material having a hydrogen content of less than 13 at. % and in some embodiments, a hydrogen content greater than 4 at. %.

P-type doping in GaN material is most commonly achieved using Mg dopant atoms which are considered among the most effective dopants (see e.g., J. K. Sheu & G. C. Chi, "The doping process and dopant characteristics of GaN", J. Phys.: Condens. Matter 14 (2002) R657-R702). Typically, Mg dopants in MOCVD-grown GaN layers are passivated by hydrogen during the epitaxial growth process. MOCVD-grown epitaxial structures require a post-growth high temperature anneal to activate the Mg dopants for effective device operation.

Detrimental hydrogen release and migration can occur at multiple steps during the fabrication of a multilayer semiconductor device. The hydrogen incorporated in GaN films during the growth/post-growth phase in the MOCVD reactor itself is a major source of hydrogen exposure, but further concerns stem from the hydrogen to which GaN-based materials or devices are exposed during subsequent device fabrication steps. For instance, a common semiconductor process step resulting in significant device hydrogen exposure is a well-known process referred to as "plasma enhanced chemical vapor deposition" ("PECVD") of dielectric layers.

To address these concerns and other deficiencies in the prior art, in one aspect, a multilayer GaN-based III-Nitride light emitting device is disclosed (an exemplar embodiment is shown in FIG. 1) and may comprise a plurality of stacked light emitting layers wherein at least one of the light emitting layers comprises a p-side contact or an n-side contact or a p-side contact and an n-side contact and a dielectric layer comprising a hydrogen content of less than 13 at. %.

In one embodiment, the dielectric layer may be a first p-side dielectric layer disposed over the p-side contact.

In one embodiment, the device may further comprise a second p-side dielectric layer comprising a hydrogen content of less than 13 at. % disposed over the first p-side dielectric layer.

In one embodiment, the device may further comprise a third p-side dielectric layer comprising a hydrogen content of less than 13 at. % disposed over the second p-side dielectric layer.

In one embodiment, the device may further comprise a fourth p-side dielectric layer comprising a hydrogen content of less than 13 at. % and preferably comprising a hydrogen content of greater than 4 at/% disposed over the third p-side dielectric layer.

In one embodiment, the dielectric layer may comprise a first n-side dielectric layer disposed over the n-side contact.

In one embodiment, the device may further comprise a second n-side dielectric layer comprising a hydrogen content of less than 13 at. % and preferably comprising a hydrogen content of greater than 4 at/% disposed over the first n-side dielectric layer.

At least one dielectric layer may be deposited using a tetraethyl orthosilicate (TEOS) precursor.

Any of the dielectric layers may be used for oxide-oxide fusion bonding and any of the dielectric layers may have a hydrogen content above 4 at. % and below 13 at. %.

The device may comprise a plurality of stacked light emitting layers that are separately configured to each emit light of a different wavelength such as a red, green and blue light.

Embodiments of the disclosure may further comprise a controller layer configured to spatially, chromatically and temporally control light emission from each of the respective layers by means of drive circuitry contained on the controller layer.

The device may comprise a first controller layer dielectric layer comprising a hydrogen content of less than 13 at. % disposed over the controller layer. In one embodiment, the device may further comprise a second dielectric layer (which may be optional) with a hydrogen content of less than 13 at. % disposed over the first dielectric layer disposed on the controller layer. One of the dielectric layers may preferably have hydrogen content of greater than 4 at. %, but less than 13 at. %. The dielectric layers on the controller layer mentioned above are specific layers utilized in the heterogeneous integration of the controller layer and the plurality of stacked light emitting layers.

The device may comprise an optically transparent conductive oxide (TCO) contact layer disposed in an aperture area.

Any or all of the low hydrogen dielectric layers described herein may comprise a via layer, a bonding layer, a passivation layer, or any combination of such layers. Desired low hydrogen content is applicable to all the dielectric layers. It has been determined that dielectric layers useful as bonding layers enabling low temperature fusion bonding do incorporate some hydrogen. It is well-known that low temperature (silicon) oxide-oxide fusion bonding is due to condensation reactions between Si—OH groups on opposing bonding surfaces, and hence for dielectric films used as bonding layers, it may not be preferable to have ultra-low hydrogen incorporation (e.g., less than 4 at. % for PECVD films).

The dielectric layers described herein may be deposited using an e-beam, sputtering or physical vapor deposition (PVD), PECVD, atomic layer deposition (ALD) or high density plasma (HDP) process.

FIG. 1 is a schematic cross-sectional view of a GaN-based III-V Nitride p-side up (emitting surface) multilayer light emitting device according to one embodiment. In the exemplar multilayer GaN-based III-Nitride light emitting structure of device 1 of FIG. 1, a CMOS controller layer 10 is stacked and bonded to a red light emitting layer 20, a green light emitting layer 30, a blue light emitting layer 40 and a cover layer 50 by means of a plurality of via and bonding layers (V1-12 and B1-8), comprised of dielectric oxide materials. The red light emitting layer 20 may also comprise a GaAs-based or GaP-based epi-structure.

The stacked light emitting layers 20, 30 and 40 are configured whereby electrical signal, power and ground paths are routed vertically through the stack of layers by means of metal traces and through-hole vias (not shown), certain of which electrically couple the p-side contacts on the various light emitting layers 20, 30 and 40 to user-defined locations to enable the individual control of light emission from the respective layers.

P-side contacts P60A, P60B and P60C form ohmic contacts with the p-side GaN of their respective light emitting layers as do N-side contacts N60A, N60B and N60C on the opposing n-side GaN surfaces of respective light emitting layers 20, 30 and 40. N-side contact N60A may comprise an optically reflective metal surface area where the N-side contact is fabricated from, for instance, an AuGe or PdGe material for a GaAs-based or GaP-based red light emitting layer, or a TiAl material for a GaN-based red light emitting layer.

Metal-based p-side contacts P60A-C on light emitting layers 20, 30 and 40, respectively, typically do not cover their entire emissive surface area to enable light transmission 70 through and out of the light emitting layers at optical apertures 80 and out of the device 1 and into an optoelectronic system in which device 1 is integrated.

In such a device configuration, at least one via layer comprising an optically transparent dielectric material may contact a majority of the GaN material of the emissive surface of light emitting layers 20, 30 and 40 as is schematically depicted in FIG. 1.

Also depicted in FIG. 1, in one embodiment, apertures 80 through which light is transmitted through layers 20, 30 and 40 of device 1 may be provided with one or more optically transparent conductive oxide (TCO) 90 contact layers over which dielectric via layers such as V3, V7 or V11 are then deposited. TCOs are doped metal oxides typically used in optoelectronic devices such as flat panel displays and photovoltaics and may include, for instance, indium tin oxide, zinc oxide, aluminum doped zinc oxide, and/or gallium doped zinc oxide.

Both metal-based p-side contacts and the TCO-based aperture area contact layers may be provided which are integrated together as schematically depicted in FIG. 1 as a non-limiting example. The metal-based p-side contact and the TCO layer are then electrically interconnected in various ways as is known in the microelectronic fabricating arts which are not depicted in the schematic for clarity.

A TCO-based p-side contact scheme alone, without the use of p-contacts based on metals, may also be used in one embodiment. While TCO contact layers 90 may cover the majority of the p-side GaN surface of the exemplar device 1 illustrated in FIG. 1, such use unfortunately does not completely mitigate the detrimental effects of hydrogen exposure by device 1 during fabrication in that hydrogen is known to diffuse through a TCO layer as well as through a micro-LED pixel sidewall dielectric (not shown) into the structure of device 1. Similar concerns are applicable to GaN-based III-Nitride LEDs in general where PECVD-type dielectrics are used as device encapsulation layers.

Typical metal-based p-side contacts to GaN commonly contain Ni, Pt, Pd or Ag, among other metals or alloys. GaN p-side contact performance and stability is negatively affected by thermal exposure subsequent to their fabrication and annealing, especially in the presence of hydrogen-containing dielectrics. Performance degradation of GaN p-side contacts for a given thermal-plus-hydrogen exposure varies depending on metal/alloy choices in the p-side contact stack, the doping level of the p-GaN, background hydrogen content in the p-GaN, and the selection of dielectric deposition process steps.

The optimal selection of the p-side contact stack metal composition enables improved thermal stability of device 1. However, even with optimal p-side contact selection, hydrogen exposure-based performance degradation may still occur depending on the selection of the dielectrics deposited within the device stack after the formation of the p-side contacts and their subsequent annealing.

In this respect, requirements for hydrogen content and the nature of hydrogen incorporation in dielectric layers for multilayer GaN-based III-Nitride light emitting devices differ significantly from Si-based devices. For Si devices, hydrogen is beneficial as it ties up Si "dangling bonds", i.e., an unsatisfied valence on an immobilized atom. Also, Si—H bonds in inter-metal Si-based dielectric films have been reported to improve Si device reliability due to water-blocking by Si—H bonds (see e.g., K. Machida, N. Shimoyama, J. Takahashi, Y. Takahashi, N. Yabumoto, and E. Arai, IEEE Trans. Electron Devices 41, 709 (1994)).

Silicon oxide and silicon nitride are common dielectrics used in the fabrication of electronic and opto-electronic devices, particularly GaN-based micro-LED devices like the QPI® display. For a fixed process (PECVD for example) used for device fabrication, the hydrogen content of the deposited dielectric varies greatly depending on the choice of precursors and deposition parameters.

Figure 2:
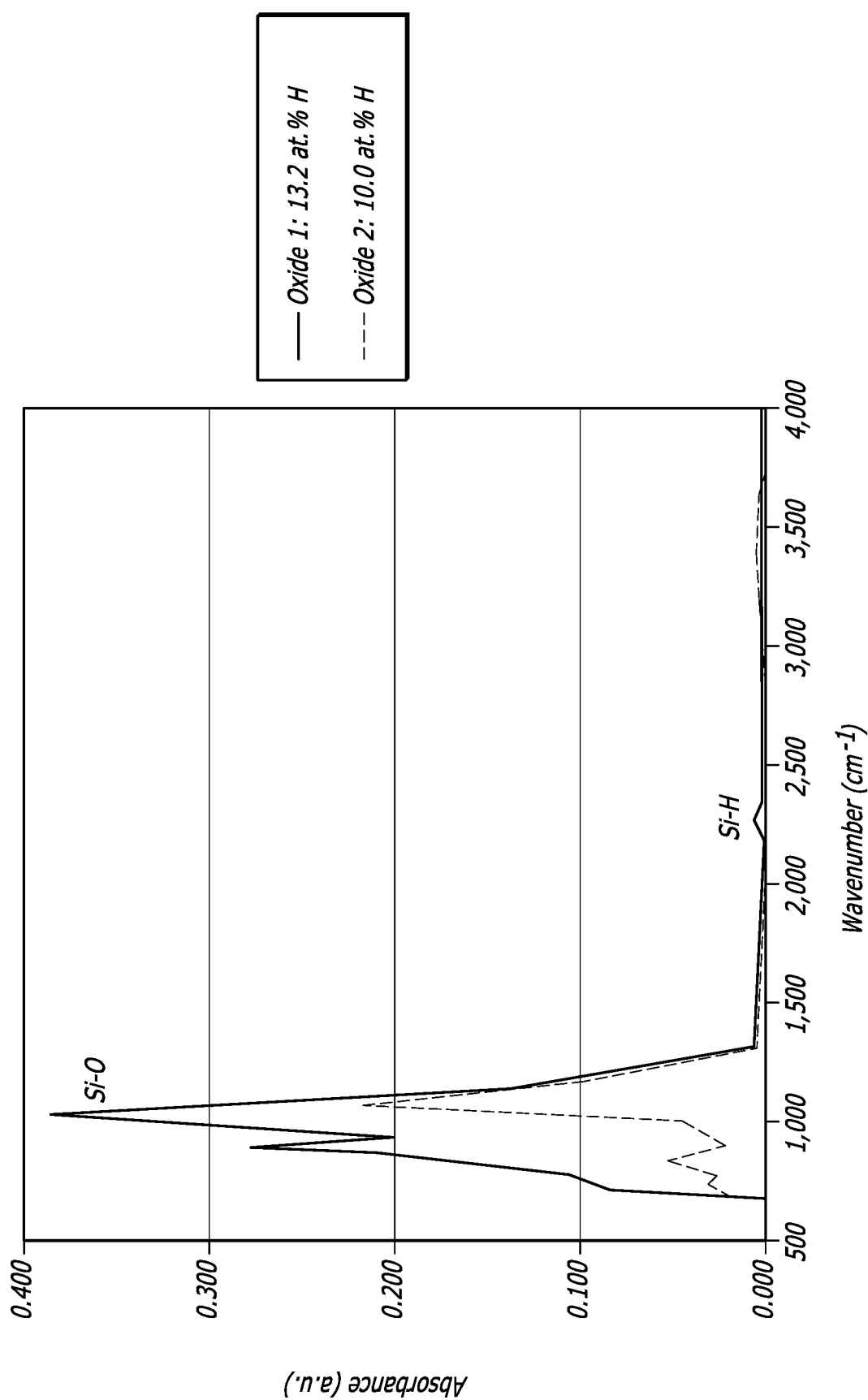
FIG. 2 is a Fourier Transform Infrared Spectroscopy (FTIR) spectroscopy data plot showing absorption of a first oxide having a hydrogen content equal to or greater than 13 atomic percent, or at. % ("Oxide 1"), and having a comparatively high number of Si—H chemical bonds as compared to a second oxide having a hydrogen content lower than 13 at. % ("Oxide 2") and having a comparatively low number of Si—H chemical bonds wherein peaks in absorbance signify various bond-related energies (translational, rotational components of bond energies).
Figure 3:
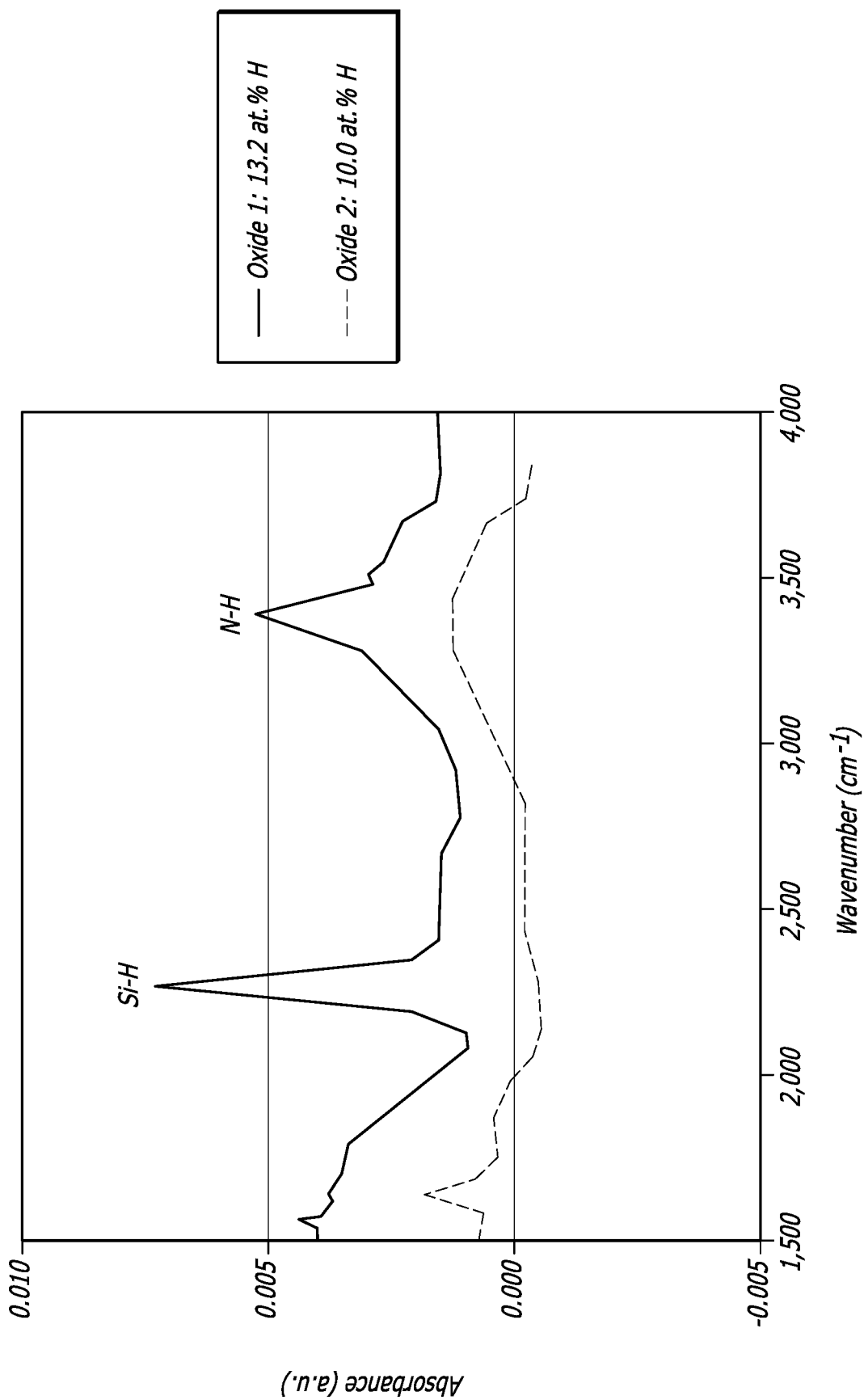
FIG. 3 is an FTIR spectroscopy data plot illustrating a close-up of absorption in the 1500-4000 cm$^{-1}$ wavenumber range of Oxide 1 having a comparatively high number of Si—H chemical bonds as compared to Oxide 2 having a comparatively low number of Si—H chemical bonds wherein the absorption due to Si—H bond stretching, N—H bond stretching and associated O—H bonds are identifiable and where it is shown that there is comparatively low Si—H-related absorption from Oxide 2 as compared to that of Oxide 1.

In FIG. 2 and FIG. 3, Fourier transform infrared spectroscopy (FTIR) data plots generated from results of tests run illustrate absorption peaks from PECVD oxides having different Si—H bonding configurations. A first oxide, (referred to as "Oxide 1" in solid line) is seen to exhibit significant FTIR absorption peaks at a wavenumber of 2250 $cm^{-1}$, signifying the presence of an undesirably high number of Si—H bonds. Hydrogen may also be present in dielectric layers in the form of Si—OH bonds and Si—NH bonds.

A second oxide (referred to as "Oxide 2" in dashed line) is seen to exhibit comparatively low absorption from Si—H bond stretching as is desired for high performance, low degradation GaN p-side contacts. Also, the illustrated higher wavenumber of the primary absorbance peak of Oxide 2 (which is related to the stretching motion of oxygen atoms, labeled "Si—O") indicates a more pure and stable oxide.

Silane ($SiH_4$) and tetraethyl orthosilicate (TEOS) are two precursors that are commonly used for oxide deposition. When silane is used as a precursor for dielectric layer, a high percentage of hydrogen impurities are incorporated into the layer unlike a layer that is fabricated using a TEOS precursor, as is evidenced by the deposition reactions shown below.

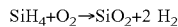

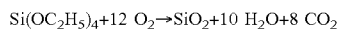

In the process of fabricating an oxide layer, Oxide 1 is deposited using a silane ($SiH_4$) precursor and Oxide 2 is deposited using a tetraethylorthosilicate (TEOS) precursor.

Silane precursor oxides are seen to exhibit significant absorption peaks at a wavenumber of 2250 $cm^{-1}$, signifying undesirable Si—H bonding.

On the other hand, TEOS precursor oxides desirably exhibit comparatively lower absorption from Si—H bonding. The use of a TEOS precursor for the fabrication of dielectric passivation, via and bonding layers has been determined to produce passivation, via and bonding layers having a hydrogen content above 4 at. % but less than 13 at. %.

It is noted that certain silane-based and other precursor-based deposition processes can be specifically engineered to provide a low hydrogen content dielectric layer. Usage of a low hydrogen content dielectric layer having a hydrogen content less than 13 at. % deposited by any process (such as e-beam, PVD, PECVD, HDP or atomic layer deposition process), precursor material, (such as TEOS or specially engineered silane precursor), or any combination of processes or materials is contemplated as falling within the scope of the disclosure.

Fluorinated chemistry is known to reduce the hydrogen content of nitride films (see e.g., C-P. Chang, D. L. Flamm, D. E. Ibbotson & J. A. Mucha, "Fluorinated chemistry for high-quality, low hydrogen plasma-deposited silicon nitride films", J. Appl. Phys. 62, 1406 (1987)). In addition to tool configuration (see e.g., G. Lucovsky & D. V. Tsu, "Plasma enhanced chemical vapor deposition: Differences between direct and remote plasma excitation", J. Vac. Sci. Technol. A 5 (4), July/August 1987), dilution of silane-based precursor gas mixtures with helium (He) is also known to reduce the hydrogen content of both silane precursor oxides (see e.g., P. G. Pai, S. S. Chao, Y. Takagi & G. Lucovsky, "Infrared spectroscopic study of $SiO_x$ films produced by plasma enhanced chemical vapor deposition", J. Vac. Sci. Technol. A 4 (3), May/June 1986) and silane precursor nitrides (see e.g., G. N. Parsons, J. H. Souk & J. Batey, "Low hydrogen content stoichiometric silicon nitride films deposited by plasma-enhanced chemical vapor deposition", J. Appl. Phys. 70, 1553 (1991)). Also, the selected oxidizer-to-silane ratio (for example, $N_2O$/silane) can be increased by a user in order to reduce number of Si—H chemical bonds present in silane-based oxides, while at the same time beneficially increasing the Si—OH chemical bonds (see e.g., M. F. Ceiler, P. A. Kohl & S. A. Bidstrup, "Plasma-enhanced chemical vapor deposition of silicon dioxide deposited at low temperatures", J. Electrochem. Soc. 142 (6) 2067 (1995)).

Particularly in the case of Ni-based p-side contacts to GaN, a stronger oxidizing environment prevents the reduction of NiO which enables a robust p-GaN ohmic contact property. Similarly, varying the $N_2/SiH_4$ ratio reduces the hydrogen content of nitride films.

Minimizing the hydrogen content of passivation layer dielectrics and via layer dielectrics improves the performance of the multilayer III-V light emitting device. However, for dielectric layers serving as bonding layers, it is important to note that it is not necessarily desirable to have an arbitrarily low hydrogen content. In the case of oxide layers used for fusion bonding, Si—OH groups (silanols) enable bond energy, and silanol groups in close proximity to each other in the bulk of the film improve the bonding ability of the oxide layer (see e.g., W. Lin, L. Shi, Y. Yao, A. Madan, T. Pinto, N. Zavolas, R. Murphy, S. Skordas & S. Iyer, "Low-temperature oxide wafer bonding for 3-D integration: Chemistry of bulk oxide matters", IEEE Trans. Semicond. Manuf. 27, 426 (2014)). As a consequence, for oxide layers used as bonding layers, there is preferably a minimum hydrogen content in the layer of greater than 4 at. % (for PECVD films) to improve performance during low temperature fusion bonding; a required process for enabling heterogeneous integration of CMOS substrate and light emitting III-V multilayers.

It is further noted that hydrogen migration from dielectric layers to the III-V light emitting layers may occur during the elevated temperature associated with the dielectric deposition process. Reduction of dielectric deposition process temperature enables reduced overall device thermal budget, but leads to films with enhanced, (i.e., higher) moisture content, which should be addressed in separate process steps.

Figure 4:
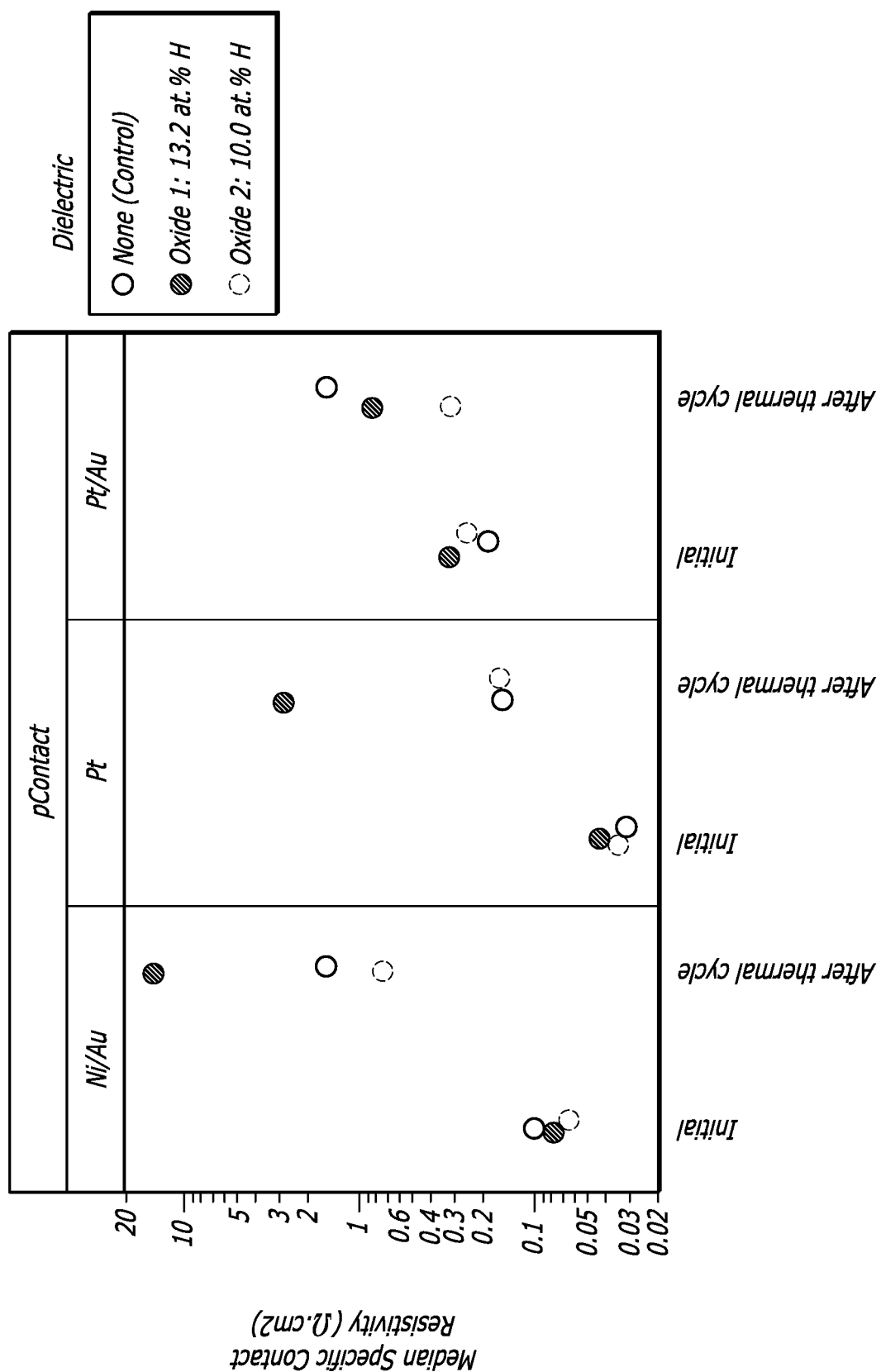
FIG. 4 is a plot illustrating the effect of thermal cycling on specific contact resistivity of GaN-based III-V Nitride p-side contacts with and without the presence of low hydrogen (i.e., having less than 13 at. % hydrogen) dielectric layers deposited over the p-side contacts and GaN surface before thermal cycle wherein Oxide 1 is seen to have a comparatively high number of Si—H chemical bonds while Oxide 2 has a comparatively low number of Si—H chemical bonds wherein the overall thermal stability is seen as significantly improved in the presence of Oxide 2.

FIG. 4 is a plot illustrating the effect of thermal cycling on specific contact resistivity of GaN-based III-V Nitride p-side contacts. In the plot of FIG. 4, performance data is shown from actual GaN p-side contacts (using linear transmission line model structures) based upon a device process thermal cycling in the presence of hydrogen-containing dielectrics. Data from Ni/Au, Pt and Pt/Au contacts to p-GaN from initial condition (after anneal of p-side contacts to GaN) and final condition (after dielectric deposition followed by thermal cycle and dielectric wet etch) are measured as shown.

The plot of FIG. 4 illustrates the result of desirable retention of low (median) specific contact resistivity of p-contacts to GaN through thermal cycle in the presence of dielectrics that is obtained when a low hydrogen content dielectric is used having a hydrogen content of less than 13 at. %.

Thermal stability of GaN-based III-nitride device p-side contacts hence is dependent on the dielectric process used in device fabrication and dielectrics with comparatively low Si—H chemical bonds enable improved final performance of GaN-based III-nitride devices.

E-beam and sputter deposited dielectrics contain comparatively low Si—H chemical bonds and hence enable improved final performance of GaN based III-Nitride devices.

The low hydrogen dielectric layers herein may serve different device 1 functions (such as passivation, inter-metal (via) or bonding functions) and comprise metal interconnect features contained within the low hydrogen dielectric layers. Light emitting layers 20, 30 and 40 may be stacked and bonded with CMOS controller layer 10 and cover layer 50 by fusion bonding of the dielectric layers, with the embodiment shown in FIG. 1 having four dielectric layers (e.g., V3, V4, V5, B3) over the p-side contact of each of the semiconductor light emitting layers 20, 30 and 40, and having two dielectric layers (e.g., B2, V2) over the n-side contact of each of the light emitting layers 20, 30 and 40.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by any claims in any subsequent application claiming priority to this application.

For example, notwithstanding the fact that the elements of such a claim may be set forth in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus, if an element can be understood in the context of this specification as including more than one meaning, then its use in a subsequent claim must be understood as being generic to all possible meanings supported by the specification and by the word itself.

The definitions of the words or elements of any claims in any subsequent application claiming priority to this application should be, therefore, defined to include not only the combination of elements which are literally set forth, but all equivalent structure, material or acts for performing substantially the same function in substantially the same way to obtain substantially the same result. In this sense, it is therefore contemplated that an equivalent substitution of two or more elements may be made for any one of the elements in such claims below or that a single element may be substituted for two or more elements in such a claim.

Although elements may be described above as acting in certain combinations and even subsequently claimed as such, it is to be expressly understood that one or more elements from a claimed combination can in some cases be excised from the combination and that such claimed combination may be directed to a subcombination or variation of a subcombination.

Insubstantial changes from any subsequently claimed subject matter as viewed by a person with ordinary skill in the art, now known or later devised, are expressly contemplated as being equivalently within the scope of such claims. Therefore, obvious substitutions now or later known to one with ordinary skill in the art are defined to be within the scope of the defined elements.

Any claims in any subsequent application claiming priority to this application are thus to be understood to include what is specifically illustrated and described above, what is conceptually equivalent, what can be obviously substituted and also what essentially incorporates the essential idea of the disclosure.

What is claimed is:

1. A III-V semiconductor device comprising: a III-V semiconductor layer;
    a p-contact defining an ohmic contact with the III-V semiconductor layer;
    a dielectric layer encapsulating or overlying the p-contact; the dielectric layer comprising a predetermined Si—H, Si—OH or Si—NH content, wherein the dielectric layer has a hydrogen content greater than 4 at. % and less than 13 at. %;
    the Si—H, Si—OH or Si—NH content selected whereby the dielectric layer inhibits a degradation of the p-contact in a subsequent thermal cycling or annealing process to define a post-thermal cycling low resistivity of the p-contact.

2. The III-V semiconductor device of claim 1 wherein the p-contact comprises an Ni/Au material, a Pt material or a Pt/Au material.

3. The III-V semiconductor device of claim 2 wherein the resistivity is less than 10 E-02 ohm.cm2 for the Ni/Au material, less than 5 E-2 ohm.cm2 for the Pt material or less than 4E-1 ohm.cm2 for the Pt/Au material.

4. The III-V semiconductor device of claim 1 wherein the dielectric material comprises the hydrogen content within the predetermined range of atomic percent selected to minimize a p-contact resistivity resulting from a thermal degradation of the p-contact.

5. The III-V semiconductor device of claim 1 wherein the dielectric layer is used in an oxide-oxide fusion bonding process to a user-defined layer.

6. The III-V semiconductor device of claim 5 wherein the dielectric layer used for the oxide-oxide fusion bonding is deposited using plasma enhanced chemical vapor deposition (PECVD) and comprises the hydrogen content greater than 4 at. % and the hydrogen content less than 13 at. %.

7. The III-V semiconductor device of claim 1 wherein the dielectric layer is deposited using a tetraethyl orthosilicate (TEOS) precursor.

8. The III-V semiconductor device of claim 1 comprising a plurality of stacked and bonded light emitting layers wherein each light emitting layer is configured to emit a light of a different wavelength.

9. The III-V semiconductor device of claim 8 further comprising a controller layer configured to spatially, chromatically and temporally control light emission from each of the stacked and bonded light emitting layers through a drive circuitry of the controller layer.

10. The III-V semiconductor device of claim 8 further comprising an optically transparent conductive oxide (TCO) contact layer disposed in an aperture area.

11. The III-V semiconductor device of claim 8 wherein the plurality of stacked and bonded light emitting layers comprises three separate semiconductor layers, each layer separately configured to emit a red, a green or a blue light.

12. The III-V semiconductor device of claim 11 wherein the three separate semiconductor layers comprise GaN-based III-Nitride layers, a GaAs-based or a GaP-based layer wherein the blue light and the green light are emitted from the GaN-based III-Nitride layers and the red light is emitted from the GaAs-based or the GaP-based layer.

13. The III-V semiconductor device of claim 1 wherein the dielectric layer is a via layer.

14. The III-V semiconductor device of claim 1 wherein the dielectric layer is a bonding layer.

15. The III-V semiconductor device of claim 1 wherein the dielectric layer is a passivation layer.

16. The III-V semiconductor device of claim 1 wherein the dielectric layer is deposited using an e-beam process.

17. The III-V semiconductor device of claim 1 wherein the dielectric layer is sputter-deposited.

18. The III-V semiconductor device of claim 1 wherein the dielectric layer is plasma enhanced chemical vapor deposition (PECVD) deposited.

19. The III-V semiconductor device of claim 1 wherein the dielectric layer is deposited using atomic layer deposition (ALD) process.

20. The III-V semiconductor device of claim 1 wherein the dielectric layer is deposited using high density plasma (HDP) process.

* * * * *